(12) United States Patent
Wang et al.

(10) Patent No.: US 9,362,214 B2
(45) Date of Patent: Jun. 7, 2016

(54) PRE-ENCAPSULATED ETCHING-THEN-PLATING LEAD FRAME STRUCTURE WITH ISLAND AND METHOD FOR MANUFACTURING THE SAME

(71) Applicant: Jiangsu Changjiang Electronics Technology Co., Ltd., Wuxi (CN)

(72) Inventors: Xinchao Wang, Wuxi (CN); Zhizhong Liang, Wuxi (CN)

(73) Assignee: JIANGSU CHANGJIANG ELECTRONICS TECHNOLOGY CO., LTD., Wuxi (CN)

( * ) Notice: Subject to any disclaimer, the term of this patent is extended or adjusted under 35 U.S.C. 154(b) by 233 days.

(21) Appl. No.: 14/207,484

(22) Filed: Mar. 12, 2014

(65) Prior Publication Data

US 2014/0191384 A1 Jul. 10, 2014

Related U.S. Application Data

(63) Continuation-in-part of application No. PCT/CN2012/001157, filed on Aug. 28, 2012.

(30) Foreign Application Priority Data

Sep. 13, 2011 (CN) .......................... 2011 1 0268358

(51) Int. Cl.
*H01L 21/00* (2006.01)
*H01L 23/495* (2006.01)
*H01L 23/498* (2006.01)
*H01L 21/48* (2006.01)
*H01L 21/56* (2006.01)
*H01L 23/00* (2006.01)

(52) U.S. Cl.
CPC ...... *H01L 23/49558* (2013.01); *H01L 21/4828* (2013.01); *H01L 21/565* (2013.01); *H01L 23/49861* (2013.01); *H01L 24/03* (2013.01); *H01L 24/97* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2224/97* (2013.01); *H01L 2924/181* (2013.01)

(58) Field of Classification Search
CPC ................. H01L 2224/48227; H01L 21/4828; H01L 21/4832
See application file for complete search history.

(56) References Cited

U.S. PATENT DOCUMENTS 7,816,187 B2 * 10/2010 Huang ................ H01L 21/4832
257/690
8,063,470 B1 * 11/2011 Sirinorakul ......... H01L 21/4832
257/666

(Continued)

*Primary Examiner* — Zandra Smith
*Assistant Examiner* — John M Parker
(74) *Attorney, Agent, or Firm* — Matthias Scholl, PC; Matthias Scholl

(57) ABSTRACT

A method for manufacturing a lead frame structure for semiconductor packaging. The method includes providing a metal substrate having a top surface and a back surface, forming a first photoresist film on the top surface of the metal substrate, forming a top surface etching pattern in the first photoresist film using photolithography, forming a second photoresist film on the back surface of the metal substrate, forming a back surface etching pattern in the second photoresist film using photolithography, performing an etching process on the top surface and the back surface of the metal substrate, removing the first photoresist film and the second photoresist film, placing the etched metal substrate in a mold, encapsulating the etched metal substrate using the mold; and performing a plating process on the encapsulated metal substrate.

6 Claims, 4 Drawing Sheets

(56) References Cited

U.S. PATENT DOCUMENTS

| | | | |
|---|---|---|---|
| 2007/0126112 A1* | 6/2007 | Cho | H05K 1/056 257/700 |
| 2011/0163433 A1* | 7/2011 | Toda | H01L 21/4828 257/676 |
| 2012/0018867 A1* | 1/2012 | Toda | H01L 21/4828 257/676 |

* cited by examiner

PRE-ENCAPSULATED ETCHING-THEN-PLATING LEAD FRAME STRUCTURE WITH ISLAND AND METHOD FOR MANUFACTURING THE SAME

CROSS-REFERENCE TO RELATED APPLICATIONS

This application is a continuation-in-part of International Patent Application No. PCT/CN2012/001157 with an international filing date of Aug. 28, 2012, designating the United States, now pending, and further claims priority benefits to Chinese Patent Application No. 201110268358.9 filed Sep. 13, 2011. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to the field of semiconductor assembly or packaging, and more particularly to lead frame structures and methods for manufacturing the same.

2. Description of the Related Art

Conventional lead frame structures used in semiconductor packaging processes include the following two types. One type is a Quad Flat No-Lead (QFN) metal lead frame. For this type, as shown in FIG. 11, to prevent molding compound overflow from the back surface of the lead frame during an encapsulation process on the top surface of the lead frame, a layer of expensive high-temperature resistant film 23 is affixed on the back surface of the lead frame. Such a lead frame may have certain disadvantages:

1) Because an high-temperature film is affixed on the back surface of the metal lead frame, the cost of lead frame is substantially increased (e.g., at least 50%);

2) The adhesive film affixed on the back surface of the metal lead frame often is a soft organic material. During subsequent assembly and wire bonding processes, high-temperature baking may cause organic volatile contamination, which may have direct impact on the bonding characteristics between the wires and the top surface of the chip and between the wires and the top surface of the lead frame. It may even cause bonding failure (so-called delamination) between the molding compound and the top surfaces of the chip and lead frames in later packaging processes;

3) In the subsequent wire bonding process, because the back surface of the lead frame is affixed with the soft organic adhesive film, part of the bonding strength may be absorbed by the soft organic adhesive film. This may increase the difficulty for wire bonding, cause unstable wire bonding yield, and may cause reliability issues;

4) Because the back surface of the lead frame is affixed with the soft organic adhesive film, the metal wire material used in the wire bonding process may be limited to relatively softer and more expensive gold wires. Other relatively harder but less expensive materials, such as copper, aluminum, or other metal wires or strips, may be undesirable; and 5) In the subsequent molding process, because the back surface of the lead frame is affixed with the soft organic adhesive film, the molding pressure during the molding process may cause certain mold bleeding between the lead frame and the adhesive film, which may put bleeding material between the lead pad 22 or die pad 21 and the organic adhesive film, as shown in FIGS. 12 and 13 (molding compound under certain metal leads and die pad on the left side of the drawing).

The other type is a two-side etching and pre-encapsulated lead frame, as shown in FIG. 14. To form this type of lead frame, an etching process is first performed on the back surface of the metal substrate, and the etched areas on the back surface are sealed with encapsulation material. Further, etching and plating processes for inner leads are performed on the top surface of the metal substrate. However, such a lead frame structure may have following disadvantages:

1) Because the manufacturing process of the lead frame is complicated, manufacturing cost may be increased;

2) Because the lead frame needs to be etched from the top surface and the back surface separately, it may likely cause dislocation due to re-positioning errors when setting the top surface and back surface etching positions.

SUMMARY OF THE INVENTION

In view of the above-described problems, it is one objective of the invention to provide a method for manufacturing a lead frame structure for semiconductor packaging. The method comprises providing a metal substrate having a top surface and a back surface, forming a first photoresist film on the top surface of the metal substrate, and forming a top surface etching pattern in the first photoresist film using photolithography. The method also comprises forming a second photoresist film on the back surface of the metal substrate, forming a back surface etching pattern in the second photoresist film using photolithography, and performing an etching process on the top surface and the back surface of the metal substrate simultaneously using the top surface etching pattern and the back surface etching pattern as the respective masks to form etched regions in the metal substrate, an island, and a plurality of leads. Further, the method comprises removing the first photoresist film and the second photoresist film, placing the etched metal substrate in a mold, and encapsulating the etched metal substrate using the mold such that a molding compound is filled in the etched regions, areas between the island and the plurality leads, and areas between the plurality of leads, while exposing top surfaces and back surfaces of the island and the plurality leads. The method also comprises performing a plating process on the encapsulated metal substrate to form a first metal layer on the exposed top surfaces of the island and the plurality leads, and a second metal layer on the exposed back surfaces of the island and the plurality leads.

It is another objective of the invention to provide a lead frame structure for semiconductor packaging. The lead frame structure comprises an island and a plurality of leads formed based on a metal substrate by an etching process. The etching process is performed by providing the metal substrate, forming a first photoresist film on a top surface of the metal substrate, forming a top surface etching pattern in the first photoresist film using photolithography, forming a second photoresist film on a back surface of the metal substrate, forming a back surface etching pattern in the second photoresist film using photolithography, etching the top surface and the back surface of the metal substrate simultaneously using the top surface etching pattern and the back surface etching pattern as the respective masks to form etched regions in the metal substrate, an island, and a plurality of leads, and removing the first photoresist film and the second photoresist film. The lead frame also comprises a molding compound used to encapsulate the etched metal substrate with the island and plurality of leads by a pre-encapsulation process. The pre-encapsulation process is performed by placing the etched metal substrate in a mold, and encapsulating the etched metal substrate using the mold such that the molding compound is filled in the etched regions, areas between the island and the plurality leads, and areas between the plurality of leads, while exposing top surfaces and back surfaces of the island and the plurality leads. Further, the lead frame structure comprises a first metal layer and a second metal layer formed on the encapsulated metal substrate by a plating process. The first metal layer is formed on the exposed top surfaces of the island and the plurality leads, and the second metal layer is formed on the exposed back surfaces of the island and the plurality leads.

Other aspects of the present disclosure can be understood by those skilled in the art in light of the description, the claims, and the drawings of the present disclosure.

Advantages of the invention are summarized as follows:

The lead frame structures and manufacturing methods can be applied in a variety of semiconductor packaging applications for different carriers with different substrates and filling materials. For example, the lead frame structures and methods are used to package plastic leaded chip carrier (PLCC), plastic quad flat pack (PQFP), ball grid array (BGA), system in package (SiP) or 3D ICs, and multi-chip module, etc.

By using the methods and structures, a lead frame structure with island can be created using an etching-encapsulation-plating process, which eliminates the need for a high-temperature resistant adhesive film on the back surface of the lead frame and all disadvantages associated with the soft adhesive film. Such lead frame structures and methods can reduce the cost of packaging materials, production processes, and productivity while increasing the reliability of the packaging processes, by simplifying fabrication processes.

By using the methods and structures, the etching process on both top surface and back surface of the lead frame can be performed simultaneously. Comparing to the two-side etching and pre-encapsulated lead frame, the process can reduce the process complexity by at least 50% and also reduce costs. Further, the re-positioning errors can also be reduced or avoided.

Figure 1:
FIGS. 1-9 illustrate an exemplary process for manufacturing a lead frame structure in accordance with embodiments of the invention.

In the drawings, the following reference numbers are used: Lead frame structure 100; Island 1; Leads 2; Molding compound 4; First metal layer 5; Second metal layer 6; Upper mold 7; Lower mold 8; Metal substrate 9; Photoresist film 10; Photoresist film 11; Etched areas 12; Lead frame manufacturing process 200; Providing a metal substrate 202; Attaching adhesive films 204; Forming etching patterns 206; Performing an etching process 208; Removing adhesive films 210; Pre-encapsulating the lead frame 212; Performing a plating process 214; Island 21; Leads 22; High-temperature resistant film 23; Molding compound 24.

DETAILED DESCRIPTION OF THE EMBODIMENTS

For further illustrating the invention, experiments detailing lead frame structures and a method for manufacturing the same are described below. It should be noted that the following examples are intended to describe and not to limit the invention.

Figure 10:
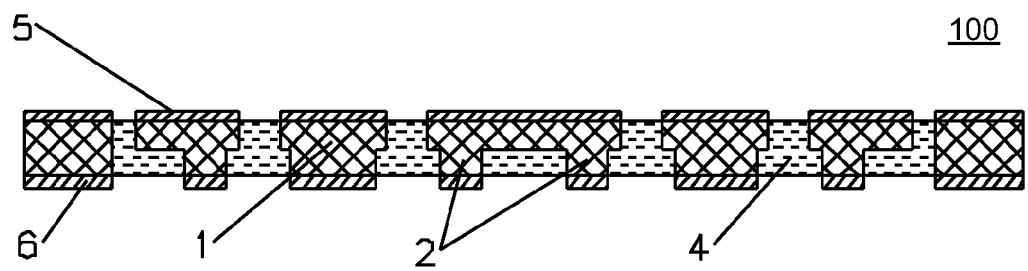
FIG. 10 illustrates a lead frame structure in accordance with one embodiment of the invention.
Figure 11:
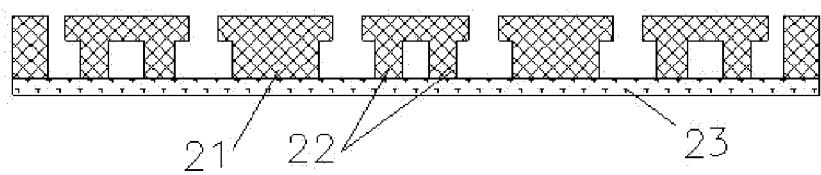
FIG. 11 shows a high-temperature resistant film affixed on a lead frame in the prior art.
Figure 12:
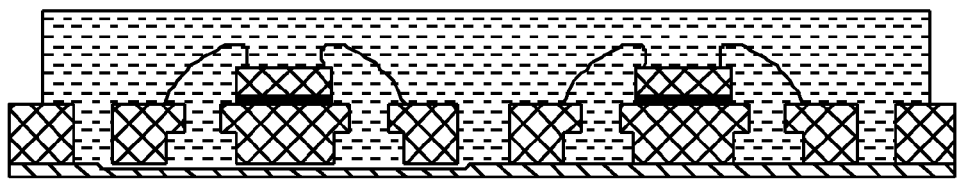
FIGS. 12-13 shows molding material infiltrated the high-temperature resistant film affixed on the lead frame in the prior art.
Figure 13:
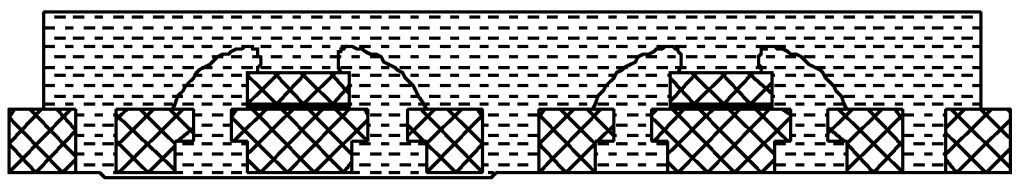
Figure 14:
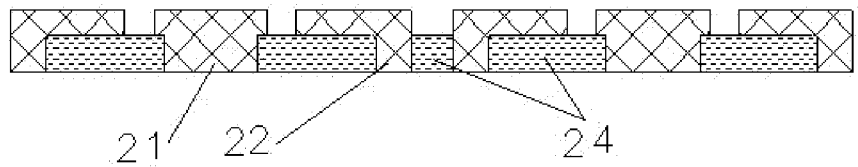
FIG. 14 shows a two-side etched lead frame in the prior art.

FIG. 10 illustrates an exemplary lead frame structure 100. As shown in FIG. 10, the lead frame structure 100 comprises a die pad or island 1, a plurality of leads 2, a first metal layer 5 on the top surfaces of the island 1 and leads 2, a second metal layer 6 on the back surfaces of the island 1 and leads 2, and a molding compound 4 filled in the etched areas and the areas between the island 1 and the leads and between the leads 2. Other components may also be involved and certain components may be omitted. The island 1 and leads 2 are made from a metal substrate (not shown in FIGS).The molding compound 4 is filled up to the top surface and the back surface of the metal substrate (e.g., island 1 and leads 2) such that both the top surface and the back surface of the metal substrate are flat.

Figure 15:
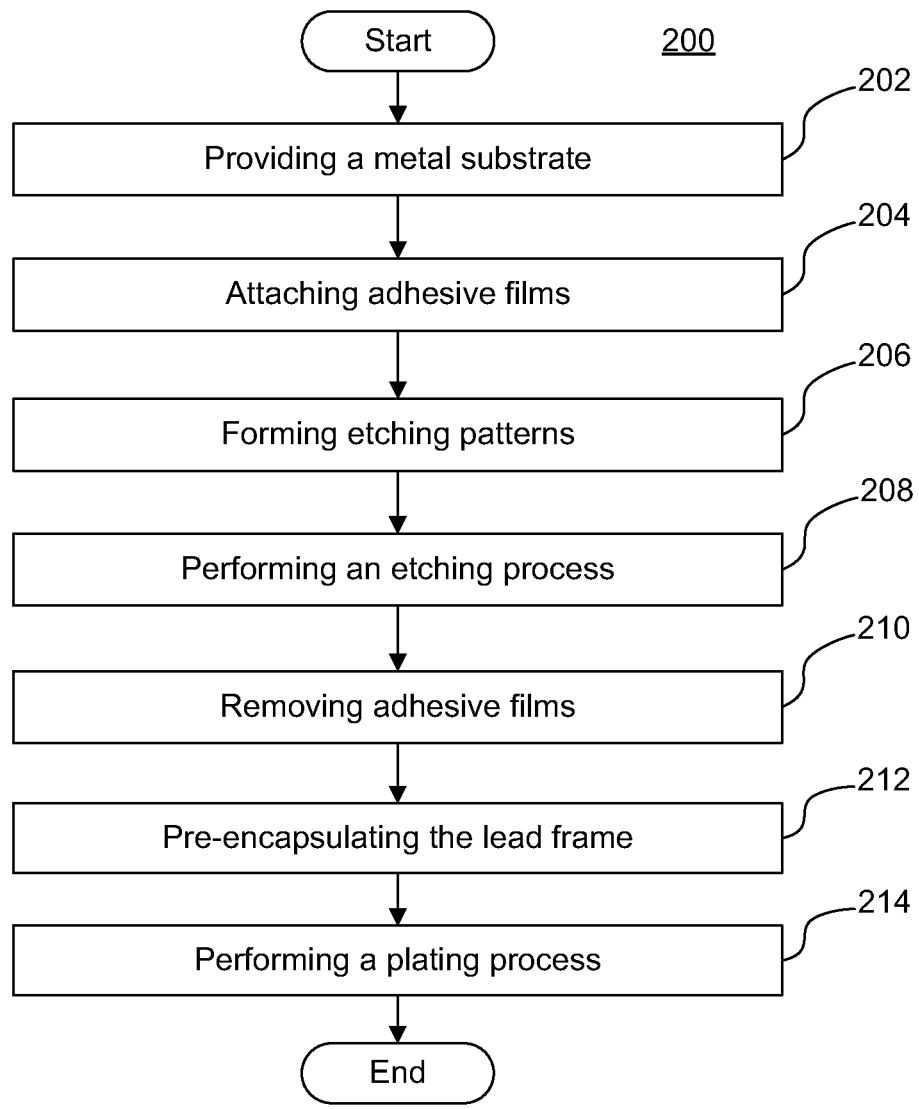
FIG. 15 shows a process flow of a method for manufacturing a lead frame structure in accordance with one embodiment of the invention.

The lead frame structure 100 is formed by an etching-encapsulation-plating manufacturing process. FIG. 15 illustrates an exemplary etching-encapsulation-plating process 200. FIGS. 1-9 illustrate corresponding structures during the etching-encapsulation-plating process.

As shown in FIG. 15, at the beginning, a metal substrate is provided (202). FIG. 1 shows a corresponding structure. As shown in FIG. 1, the metal substrate 9 is provided. The metal substrate 9 comprises a top surface and a back surface, and also has a desired thickness. The metal substrate 9 is made of any appropriate metal materials, such as copper, aluminum, iron, copper alloy, stainless steel, or nickel-iron alloy. The particular metal used for metal substrate 9 can be determined based on the functionalities and characteristics of the chips to be packaged.

Figure 2:
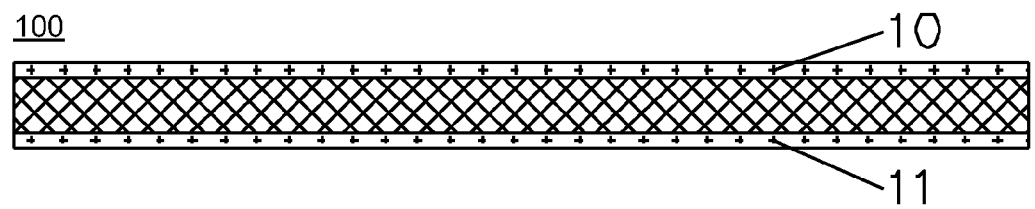

Returning to FIG. 15, after the metal substrate 9 is provided (202), adhesive films are attached to the top surface and the back surface of the metal substrate 9 (204).More particularly, as shown in FIG. 2, a photoresist film 10 is attached to the top surface of the metal substrate 9, and a photoresist film 11 is attached to the back surface of the metal substrate 9. The photoresist film 10 and photoresist film 11 are attached using certain film equipment to protect the substrate from a later etching process. Further, the photoresist film 10 and photoresist film 11 can be used in a photolithographic process, and any of the photoresist film 10 and photoresist film 11 employs a dry photoresist film or a wet photoresist film. Other types of film can also be used.

Figure 3:
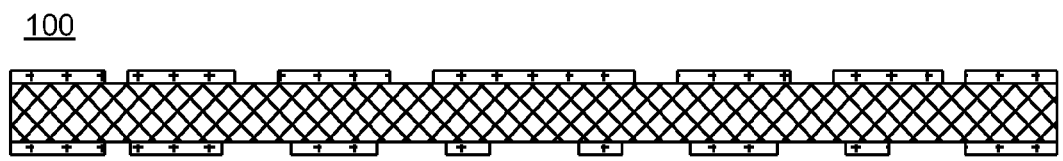

Returning to FIG. 15, after the photoresist film 10 and photoresist film 11 are attached to the metal substrate 9 (204), etching patterns may be formed based on the photoresist film 10 and photoresist film 11 (206). Specifically, as shown in FIG. 3, a top surface etching pattern is formed using the photoresist film 10 and a back surface etching pattern is formed using the photoresist film 11 via photolithography. That is, the etching patterns are formed using a photolithographic process. A top surface etching mask is used to expose the photoresist film 10, which is followed by development, and certain parts of the photoresist film 10 are removed to form the top surface etching pattern to uncover the areas on the metal substrate 9 that need to be etched. Similarly, a back surface etching mask is used to expose the photoresist film 11, which is followed by development, and certain parts of the photoresist film 11 are removed to form the back surface etching pattern to uncover the areas on the metal substrate 9 that need to be etched.

Figure 4:
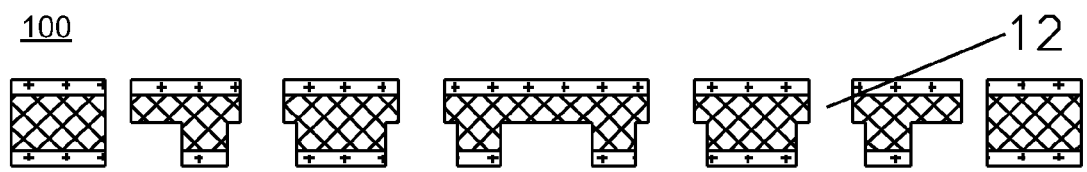

Further, as shown in FIG. 15, an etching process is performed on the top surface and back surface of the metal substrate 9 (208). The corresponding structure is illustrated in FIG. 4. As shown in FIG. 4, an etching process is performed on the exposed areas on the top surface and back surface of the metal substrate 9, which are exposed by removing parts of the photoresist films 10 and 11. That is, the top surface of metal substrate 9 is etched using the top surface etching pattern as a mask, and the back surface of metal substrate 9 is etched using the back surface etching pattern as a mask. The etching process is achieved by using a half etching or a full etching, and is performed on both the top surface and the back surface simultaneously. After the etching process, etched regions 12 are formed on the top surface and the back surface of the metal substrate 9. At the same time, island 1 and the leads 2 are also formed during the etching process.

Figure 5:
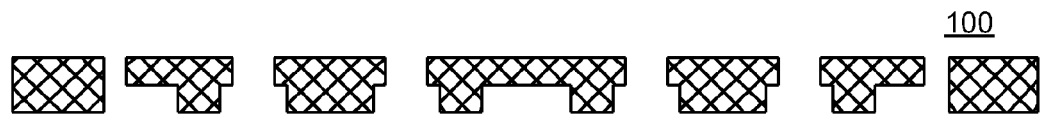

After the etching process, as shown in FIG. 15, the remaining adhesive films on the surfaces of metal substrate 9 are removed (210). As shown in FIG. 5, both remaining photoresist film 10 on the top surface of the metal substrate 9 and remaining photoresist film 11 on the back surface of the metal substrate 9 are removed. The films are removed by mechanical means or chemical means.

Figure 6:
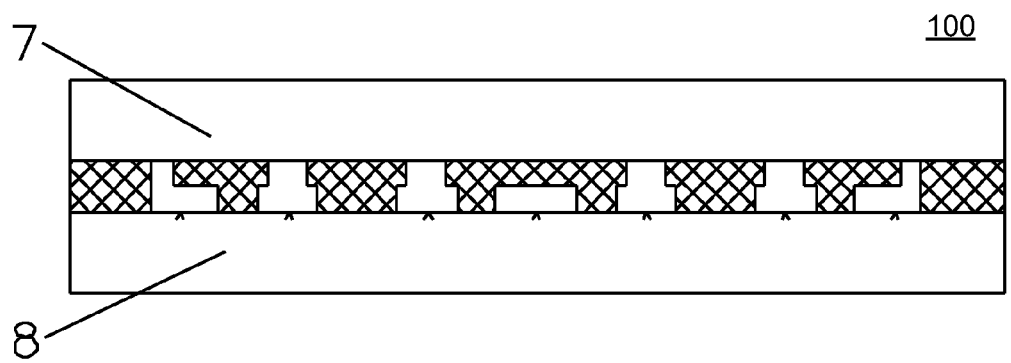
Figure 7:
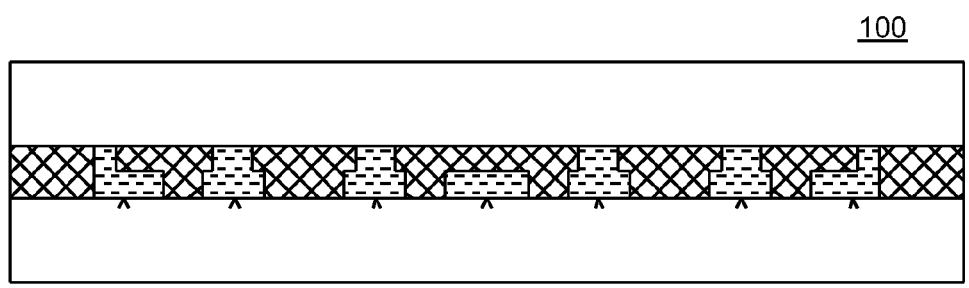
Figure 8:
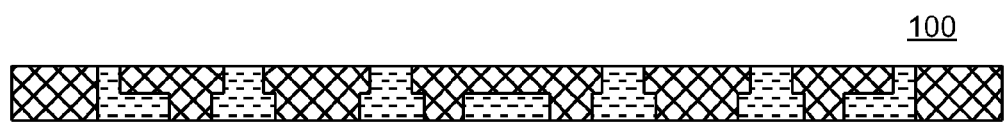

Further, the metal substrate 9 comprising the island 1, leads 2, and etched regions 12 (i.e., the lead frame) is encapsulated in a molding process or a pre-encapsulating process (212). That is, a molding compound is filled into the etched regions 12 of the metal substrate 9 using a mold. The term "pre-encapsulation" refers to the encapsulation or molding process that is performed during the lead frame manufacturing to encapsulate the lead frame before other subsequent packaging processes. FIGS. 6-8 illustrate corresponding structures formed during the molding process.

As shown in FIG. 6, the metal substrate 9, after removing the films on the top and back surfaces, is placed in the mold. The mold comprises any appropriate type of mold for IC packaging, such as an injection mold. Further, the mold comprises an upper mold 7 and a lower mold 8. Both the upper mold 7 and the lower mold 8 have a flat contact surface, and the metal substrate 9 is placed between the flat surfaces of the upper mold 7 and the lower mold 8.

The surface of the upper mold 7 comprises downward injection holes and/or the surface of the lower mold 8 comprises upward injection holes. After the metal substrate 9 is placed between the upper mold 7 and the lower mold 8, the upper mold 7 and the lower mold 8 are clamped to the top and back surfaces of the metal substrate 9. That is, the injection mold clamps the upper mold 7 and the lower mold 8 such that the top surface and the back surface of the metal substrate are in direct contact with the flat surfaces of the upper mold and the lower mold, respectively, such that the surfaces of the island and plurality leads are covered by the mold surfaces.

Further, using the downward injection holes on the upper mold 7 and/or the upward injection holes on the lower mold 8, molding compound is injected in the etched regions 12, areas between the island 1 and leads 2, and areas between leads of the leads 2, as shown in FIG. 7. The injected molding compound and the surfaces of the island 1 and leads 2 together form a flat top surface and a flat back surface on the encapsulated metal substrate.

After the molding compound is injected in the metal substrate 9, i.e., the lead frame is pre-encapsulated, the metal substrate 9 (i.e., uncompleted but encapsulated lead frame) is removed from the mold, as shown in FIG. 8. The pre-encapsulated lead frame has a flat top surface comprising the exposed top surfaces of the island 1 and leads 2 and the molding compound, and a flat back surface comprising the exposed back surfaces of the island 1 and leads 2 and the molding compound.

Figure 9:
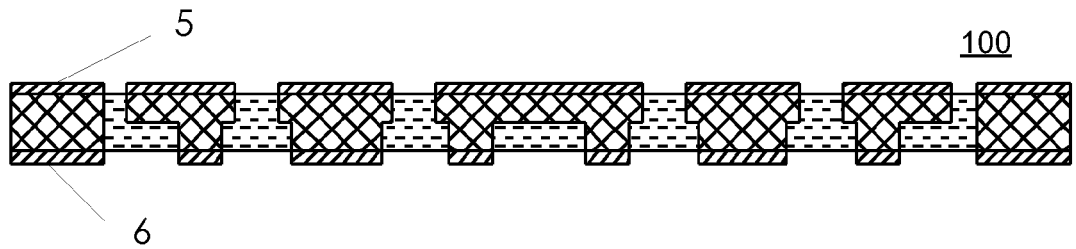

Further, as shown in FIG. 15, a plating process is performed on the pre-encapsulated lead frame (214). As shown in FIG. 9, the plating process is performed on the top surface of the lead frame and the back surface of the lead frame to form a first metal layer 5 on the top surface and a second metal layer 6 on the back surface. The first metal layer 5 and the second metal layer 6 are plated during a single plating process and at the same time. Alternatively, the plating of the first metal layer 5 and the second metal layer 6 are completed in sequence: the first metal layer 5 is plated first or the second metal layer 6 is plated first.

The plating process comprises any appropriate type of electrical or chemical plating process, such as a multi-layer electrical plating process. The first metal layer 5 is formed on the top surfaces of the island 1 and leads 2 to provide an inner contact surface for the island 1 and inner leads for leads 2. The second metal layer 6 is formed on back surfaces of the island 1 and leads 2 to provide an outer contact surface for the island 1 and outer leads for leads 2. The plating material comprises gold, nickel-gold, nickel-palladium-gold, or silver. Other materials can also be used.

After the plating process, as shown in FIG. 10, the lead frame 100 is completed. Other subsequent packaging processes can be performed on the lead frame 100 to form various packaging structures, such as single chip or multi-chip structures.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a lead frame structure for semiconductor packaging, the method comprising:
   a) providing a metal substrate having a top surface and a back surface;
   b) forming a first photoresist film on the top surface of the metal substrate;
   c) forming a top surface etching pattern in the first photoresist film using photolithography;
   d) forming a second photoresist film on the back surface of the metal substrate;
   e) forming a back surface etching pattern in the second photoresist film using photolithography;
   f) performing an etching process on the top surface and the back surface of the metal substrate simultaneously using the top surface etching pattern and the back surface etching pattern as the respective masks to form etched regions in the metal substrate, an island, and a plurality of leads;
   g) removing the first photoresist film and the second photoresist film;
   h) placing the etched metal substrate in a mold;
   i) encapsulating the etched metal substrate using the mold such that a molding compound is filled in the etched regions, areas between the island and the plurality leads, and areas between the plurality of leads, while exposing top surfaces and back surfaces of the island and the plurality leads; and j) performing a plating process on the encapsulated metal substrate to form a first metal layer on the exposed top surfaces of the island and the plurality leads, and a second metal layer on the exposed back surfaces of the island and the plurality leads.

2. The method of claim 1, wherein the etching process is a full etching process.

3. The method of claim 1, wherein:
the mold is an injection mold comprising an upper mold and a lower mold;
the etched metal substrate is placed between a flat surface of the upper mold and a flat surface of the lower mold; and
a plurality of injection holes are configured on at least one of the flat surfaces of the upper mold and the lower mold.

4. The method of claim 3, wherein encapsulating the etched metal substrate further comprises:
clamping the upper mold and the lower mold such that the top surface and the back surface of the metal substrate are in contact with the flat surfaces of the upper mold and the lower mold, respectively, such that the surfaces of the island and plurality leads are covered; and
injecting the molding compound into the etched regions, the areas between the island and the plurality leads, and the areas between the plurality of leads to form a flat top surface and a flat back surface on the etched metal substrate.

5. The method of claim 1, wherein:
the first metal layer comprises an inner surface on the island and a plurality of inner leads on the plurality of leads; and
the second metal layer comprises an outer surface on the island and a plurality of outer leads on the plurality of leads.

6. The method of claim 1, wherein the plating process uses a plating material from one of gold, nickel-gold, nickel-palladium-gold, and silver.

* * * * *